United States Patent [19]

Engel

[11] Patent Number: 4,778,720
[45] Date of Patent: Oct. 18, 1988

[54] ULTRATHIN POLYMERIC IMINE FILMS AND PROCESS FOR MAKING THE SAME

[75] Inventor: Alan K. Engel, Tokyo, Japan

[73] Assignee: Research Dev. Corp. of Japan, Tokyo, Japan; a part interest

[21] Appl. No.: 63,441

[22] Filed: Jun. 18, 1987

Related U.S. Application Data

[62] Division of Ser. No. 788,497, Oct. 17, 1985, Pat. No. 4,681,799.

[30] Foreign Application Priority Data

Jan. 11, 1984 [JP] Japan ............................ 59-229003

[51] Int. Cl.$^4$ ................... B32B 15/08; B32B 27/06
[52] U.S. Cl. .................... 428/336; 428/447; 428/458; 428/473.5; 428/930; 528/266
[58] Field of Search .............. 428/220, 473.5, 458, 428/447, 332, 336, 930; 528/266; 427/88, 89, 90, 402

[56] References Cited

U.S. PATENT DOCUMENTS

| | | | |
|---|---|---|---|
| 3,526,611 | 9/1970 | Webb | 528/266 X |
| 4,178,430 | 12/1979 | Billow | 528/266 X |
| 4,180,649 | 12/1979 | Billow et al. | 528/266 X |

OTHER PUBLICATIONS

Cemel et al., "Polymerization of Vinyl Stearate Multilayers", J. Polymer Science, vol. 1, 1972 pp. 2061-2083.
Darbault et al., J. Phys. Chem., vol. 79, No. 21, 1975 pp. 2254-2259.
Puterman et al., "The Polymerization and Structure of Mixed Multilayers of Ethyl and Vinyl Stearate", J. Colloid Interface Science, vol. 47, No. 3, Jun. 1974, pp. 705-718.
Tieke et al., "Topochemical Reactions in Langmuir-Blodgett Multilayers", Interfacial Synthesis, vol. III, Regent Advances, N.Y., 1981, pp. 365-378.

Primary Examiner—Thomas J. Herbert
Attorney, Agent, or Firm—Stephen F. K. Yee

[57] ABSTRACT

Novel ultrathin unit layers and built-up multilayers are obtained when a spreadable polyfunctional aldehyde or its precursor, particularly the alkyl Schiff base formed by its condensation with an alkyl amine, is spread on the surface of an aqueous subphase containing a diamine. The resulting polymeric imine unit layers were transferred and built up on substrates which included quartz, aluminum and chrome-plated glass, and semiconductors.

13 Claims, 1 Drawing Sheet

Figure
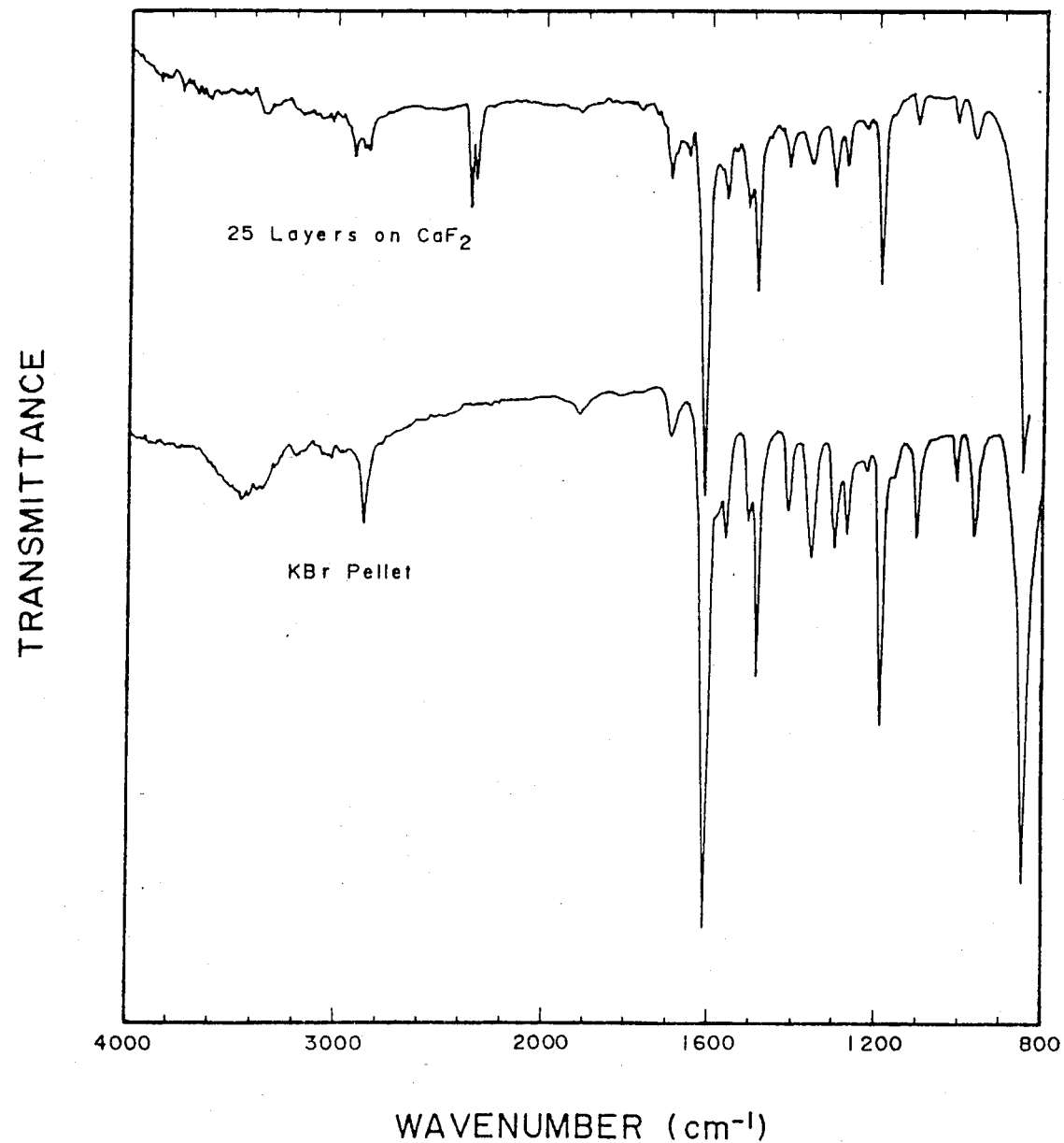

ULTRATHIN POLYMERIC IMINE FILMS AND PROCESS FOR MAKING THE SAME

This application is a division of application Ser. No. 788,497, filed Oct. 17, 1985, now U.S. Pat. No. 4,687,799.

FIELD OF THE INVENTION

This original invention relates to ultrathin unit layer and built-up multilayer films comprising a polymeric imine comprising repeat units of the formula

where R is aromatic, heteroaromatic, aliphatic, olefinic, acetylenic, or a mixture of these, and R' is aromatic, heteroaromatic olefinic, acetylenic, or a mixture of these.

This original invention relates to a process for the polycondensation synthesis of polymeric imines and the deposition onto selected substrates of said synthesized polymeric imines in the forms of unit layers and built-up multilayers.

This original invention relates to polymeric imine unit layer and multilayer films possessing a heretofore unrealized degree of thinness.

DEFINITIONS OF THE TERMS

By the phrase "unit layer" is meant the film or monolayer which is formed according to the teachings of this invention when a compound is spread on the water surface such that its thickness is less than 20 nanometers or such that the surface area occupied per molecule is less than the cross sectional area of said molecule or which forms as a result of a subsequent reaction of said film. The phrase "unit layer" also applies to the above unit layer, which is on the subphase surface, after said unit layer is transferred to a substrate. The thickness of a unit layer is less than 20 nanometers. If the molecules in the unit layer each span the thickness of said unit layer, then said unit layer can be called a "monolayer." The film which results from the one-by-one transfer of unit layers onto a substrate such that they become piled in a stack is called a "multilayer."

By the phrase "essentially monomeric" is meant a polyfunctional, reactive compound which can be introduced into the polycondensation, by means of the spreading of a surface film in the case of a polyfunctional aldehyde or a polyfunctional aldehyde precursor, or as a component of the subphase in the case of a polyfunctional amine.

By the phrase "essentially monomeric polyfunctional aldehyde precursor" is meant a compound which is capable of generating an essentially monomeric polyfunctional aldehyde monomer when spread on an appropriate aqueous subphase.

The term "polymeric imine" refers to oligomers or polymers possessing the structure,

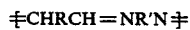

in which R is aromatic, heteroaromatic, aliphatic, olefinic acetylenic, or a mixture of these, R' is aromatic, heteroaromatic, olefinic, acetylenic, or a mixture of these, and m is greater than or equal to two.

The phrase "polymeric imine" refers to a linear or network chain compound in which at least two repeat units are linked through an imino bond.

BACKGROUND OF THE INVENTION

The following reference, which are referred to for their disclosures at various points in this application, are incorporated herein by reference.

J. Amer. Chem. Soc. 45, 521(1923) Japanese Patent Provisional Publication Nos. 138800/76; 124097/77.
J. Org. Syn. Chem., Japan, 41, 972(1983).
J. Poly. Sci., Pt A-1, 10, 2061(1972).
J. Colloid Interface Sci. 47, 705(1974).
Makromol. Chem., 175 699(1974).
J. Phys. Chem., 79, 2254(1975).
Thin Solid Films, 68, 1(1980).
Makromol. Chem., 180, 1059(1979).
"Interfacial Synthesis, Vol. III, Recent Advances," Marcel Dekker: New York, 1981.
J. Macromol. Sci. - Chem., A15, 999(1981).
Makromol. Chem., Rapid Commun., 3, 167(1982).
Macromolecules, 11, 1221(1221).
"Hakumaku (Thin Films)," in "Shin Jikken Kagaku Koza, 18, Kaimen to Colloid (Interfaces and Cooloids)," Maruzen: Tokyo, 1975; Chap. 6, pp. 439–516.
A. W. Adamson, "Physical Chemistry of Surfaces," 4th ed.; Wiley: New York, 1982; Chap. IV.
G. L. Gains, Jr., "Insolbule Monolayers at the Air/-Water Interfaces,"; Wiley: New York, 1966; Chap. 4.
Goldfinger, "Clean Surfaces: Their Preparation and Characterization for Interfacial Studies", Marcel Dekker: New York, 1970.

While polymeric imines, even wholly aromatic polymeric imines, and films made therefrom are known to the art, uniform, well-controlled films of less than 0.1 micrometers in thickness have not been heretofore produced. This prior inability to realize such films is due to inherent limitations of the until now state-of-the-art spin coating and vapor deposition processes.

Melt phase and solution phase syntheses of polymeric imines has been known to the art for many years, an early polycondensation synthesis of poly(p-phenylene terephthalaldimine) being that of R. Adams, J. E. Bullock, and W. C. Wilson [Journal of the American Chemical Society, vol. 45, p. 521 (1923)]. Representative examples include the solid state polycondensation of P. W. Morgan [Japan Patent Application No. 51-138800(1976)] and the m-cresol solution polycondensation of Suematsu [Japan Patent Application No. 52-124097(1977)]. Polymeric imines are characterized by high melting points and low solubilities [K. Suematsu and J. Takeda, Journal of Synthetic Organic Chemistry, Japan, vol. 41, pp. 972-984 (1983)]. Because of these properties, ultrathin films of polymeric imines have been heretofore unobtainable.

Also, while ultrathin unit layers and monolayer polymers are known to the art, heretofore, not only have these been limited to polymers not possessing the imine moiety in the main chain, but also they have been limited to polymers soluble in spreading solvents or which possess pendant long alkyl side chains. The following references are considered representative of the prior art in the area of polymerized monolayers and multilayers:
R. Ackermann, et al, Kolloid-Z. Z. Polym., vol. 2249, 1118 (1971), A Cemel, et al, J. Polym. Sci., Pt A-1, Vol.

10, 2061 (1972), M. Puterman, et al., J. Colloid Interface Sci., Vol 47, 705 (1974), R. Ackermann, et al, Makromol. Chem., Vol. 175, 699 (1974), A. Dubault, et al, J. Phys. Chem., Vol. 79, 2254 (1975), Banerjee, and J. Lando, Thin Solid Films, Vol. 68, 1 (1980), D. R. Day, and H. Ringsdorf, Makromol. Chem., 180, 1059 (1979), B. Tieke, V. Enkelmann, H. Kapp, G. Lieser, and G. Wegner in "Interfacial Synthesis, Vol. III, Recent Advances," Marcel Dekker: New York, 1981, K. Fukuda, Y. Shibasaki, H. Nakahara, J. Macromol. Sci.-Chem., Vol. A15, 999 (1981), and T. Folda, L. Gross, H. Ringsdorf, Makromol. Chem., Rapid Commun., Vol. 3, 167 (1982).

Amine-aldehyde condensation by grafting an aliphatic aldehyde onto a water-soluble polylysine was proposed by S. J. Valenty [Macromolecules, 11, 1221 (1978)], but the proposed graft polymers were not isolated, and neither substrate-deposited unit layers nor built-up multilayers were obtained. The imino bonds were to occur as side chains on a preformed polymer.

As mentioned above, uniform ultrathin films comprising a polymeric imine which has imino-bonds in the main chain were not heretofore obtained. Ultrathin films comprising a polymer which is not soluble in spreading solvents and which has no long alkyl side chains were also not obtained. Furthermore, unit layer and built-up multilayer films of wholly aromatic polymers have not heretofore been obtained.

SUMMARY OF THE INVENTION

This invention offers ultrathin unit layer and built-up multilayer films comprising a polymeric imine.

Said polymeric imine can be made by a process which is also an object of this invention, namely, the synthesis at the air/water interface of a polymeric imine comprising imino bonds in the main chain using spreadable polyfunctional aldehydes or polyfunctional aldehyde precursors and a subphase solution containing a polyfunctional amine.

The film of this invention comprises one or more unit layers, each of thickness less than 200 Angstroms. Said unit layer comprises a polymeric imine which comprises repeat units of the formula

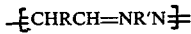

where R is aromatic, heteroaromatic, aliphatic, olefinic, or acetylenic, or a mixture of these, and R' is aromatic, heteroaromatic, olefinic, acetylenic, or a mixture of these. This invention also comprises built-up multilayers which comprise one or more of said unit layers.

This invention relates to a production method of the above mentioned ultrathin films, this method being characterized by an essentially monomeric polyfunctional aldehyde or its precursor being spread on the surface of a solution containing an essentially monomeric polyfunctional amine, and being allowed to react with the resulting surface film being transferred to a substrate.

While polymerizations, even condensation polymerizations, at the air/water interface are known to the art, heretofore, there were none which produced imine groups in the main chain, none in which at least one monomer is introduced by means of the subphase, and none which possesses a demonstrated capability of producing wholly aromatic polymeric unit layers and multilayers.

The method of this invention differs from the aminealdehyde condensation reaction proposed by S. J. Valenty [Macromolecules, 11, 1221 (1978)]. In that work, an attempt was made to graft an aliphatic aldehyde onto a water-soluble polylysine. First, these proposed graft polymers were not directly observed nor isolated, and especially neither substrate-deposited unit layers nor built-up multilayers were obtained Secondly, the proposed, but never obseved, imino bonds were to occur in side chains on a preformed polymer. The method which is an object of this invention yields, at the air/water interface, imino bonds which are integral to the main chain. Also, according to the method of this invention the polymer is generated at the air/water interface. Thirdly, the original method disclosed in this specification differs from the Valenty work in that it has been discovered that aliphatic chains are not required for the integrity of the resulting unit layers and built-up multilayers, although said chains may be optionally included and still fall within the scope of this invention. The unit layers and built-up multilayers disclosed in this specification can be wholly aromatic, a heretofore unrealized capability. By this is meant that while aliphatic chains may be included as part of the essentially monomeric polyfunctional aldehyde or its precursor, they may be eliminated during the condensation reaction and unit layers and multilayers still be obtained.

According to the teaching of this invention, the polymeric imine can be synthesized by means of a polycondensation at the air/water interface, said polycondensation also being an object of this invention. The starting materials for this polycondensation are spreadable, essentially monomeric polyfunctional aldehydes or precursors of said aldehydes and essentially monomeric polyfunctional amines.

The essentially monomeric polyfunctional aldehyde precursor is preferably the Schiff base formed by condensation of the object polyfunctional aldehyde and an alkyl amine. Examples of object polyfunctional aldehydes which can be employed include terephthalaldehyde, isophthalaldehyde, 5-nitrobenzene-1,3-dicarboxaldehyde, 5-chlorobenzene-1,3-dicarboxaldehyde, 2,4-hexadiyne-1,6-dial, 2,4-hexadiene-1,6-dial, 5-methylbenzene-1,3-dicarboxaldehyde, 4,4'-stilbenedialdehyde, malonaldehyde, azobenzene-3,5-dicarboxaldehyde, azobenzene-4,4'-dicarboxaldehyde, bibenzyl-4,4'-dicarboxaldehyde, naphthalene-1,4-dicarboxaldehyde, naphthalene-2,6-dicarboxaldehyde, diphenylether-4,4'-dicarboxaldehyde, pyridine-2,6-dicarboxaldehyde, 2,4-hexadiene-1,6-dialdehyde, 2,4-hexadiyne-1,6-dialdehyde, 1,4-butynedialdehyde and succinaldehyde.

Examples of essentially monomeric polyfunctional amines which can be used include p-phenylenediamine, m-phenylenediamine, diaminopyridine, 4,4'-diaminodiphenylether, 4,4'-diaminodiphenylmethane, 1,4-diaminonaphthalene, 2,7-diaminonaphthalene, diaminoacridine, 2,7-diaminofluorene, pararosaniline, thionine, Rhodamine 123, 1,4-diaminoanthraquinone, 1,4,5,8-tetraaminoanthraquinone, 1,6-diamino-2,4-hexadiyne, 5-methyl-1,3-diaminobenzene, 1,6-diamino-2,4-hexadiene, stilbene-4,4'-diamine, di(4-aminophenyl)ethyne, 1,4-diamino-2-butene, 4,4'-diaminoazobenzene, 4,4'-diaminodiphenylsulfide, and 1,4-di-(3-aminophenyl)-1,3-butadiene.

Examples of the repeat unit

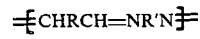

which is a constituent unit of the polymeric imine films which are an object of this invention are as follows:
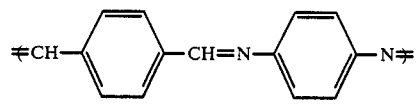 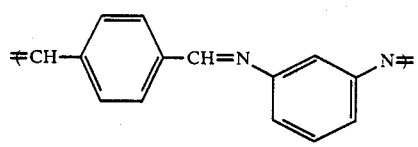
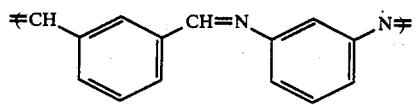 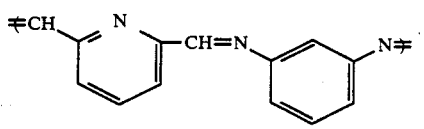
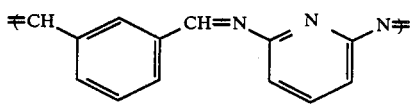 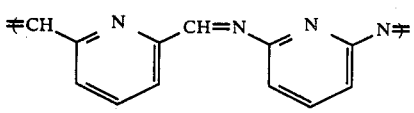
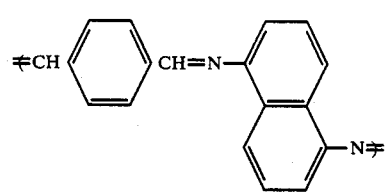
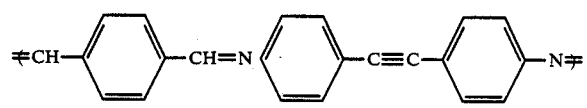
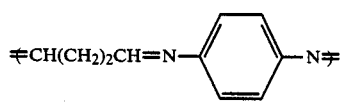 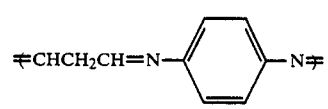
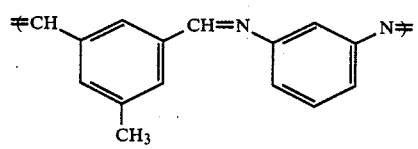 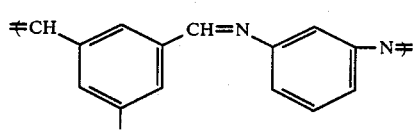
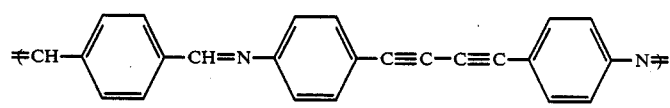
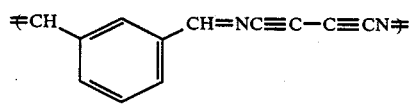 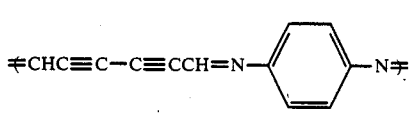
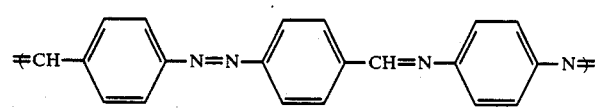

-continued

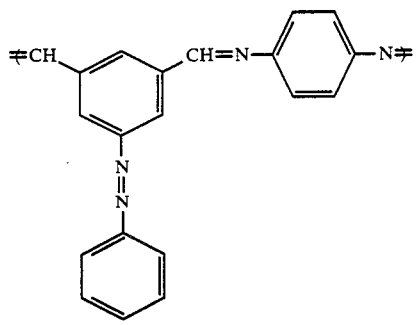

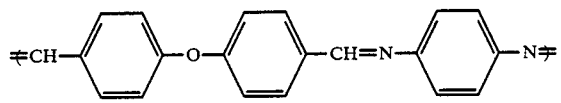

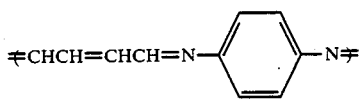    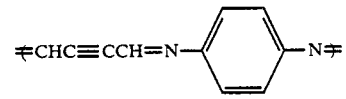

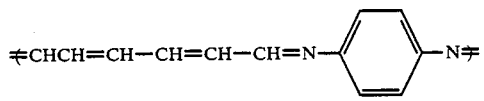

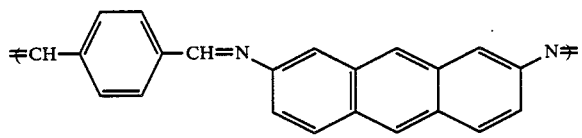

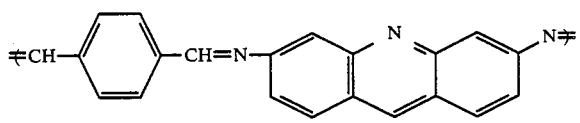    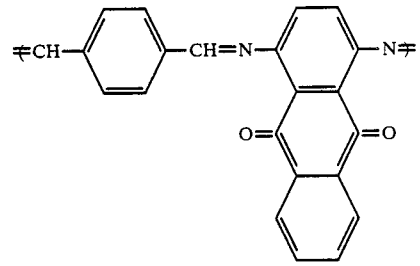

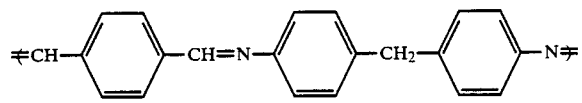

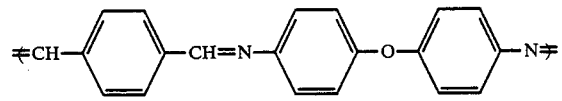

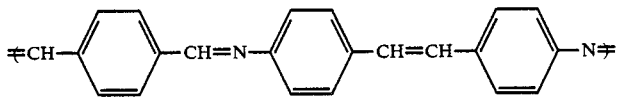

The process which is an object of this invention involves spreading an essentially monomeric polyfunctional aldehyde or the precursor of said aldehyde on the surface of an aqueous solution containing one or more essentially monomeric polyfunctional amines. The spread layer which is formed at the surface of the solution is allowed to react with the subphase to produce the desired polymeric imine unit layer.

The resulting unit layer is transferred to the desired substrate by either the Langmuir-Blodgett method or by the horizontal lifting method. These are methods known to the art and which are described in several publications including K. Fukuda, T. Ishii, "Hakumaku (Thin Films)" Shin Jikken Kagaku Koza, Vol. 18, Kaimen and Colloid (Interfaces and Colloids), (Maruzen Kabushiki Kaisha, 1975), Chap. 6, pp 439–516.

Simply stated, the Langmuir-Blodgett method involves compressing the unit layer which is at the water surface by means of an enclosure. Usually, this enclosure is formed by the sides of a trough, which contains the subphase, and two barriers. The compression is maintained at a constant value. This can be accomplished by means of a waxed thread and a piston oil, but nowadays is usually achieved with automated troughs such as those manufactured by Lauda, Kyowa Science, Takahashi Seiki, Joyce-Loebl, and others. While a constant surface pressure is being applied, the substrate, held vertically, is raised and lowered through the subphase surface. The unit layer is transferred to the substrate, either during raising (Z-type), lowering (X-type), or both (Y-type). The preferred raising and lowering speeds are described below.

For the horizontal lifting method, usually a long, narrow trough is used, for example, 5 cm in width by 200 cm in length. The unit layer is compressed and the substrate held horizontally against the surface. Usually, an isolating barrier is placed around the substrate and the unit layer situated between this barrier and the substrate is removed by aspiration. The substrate is then lifted from the surface, taking the unit layer with it.

Prior to transfer, the subphase may be changed in order to provide conditions more suitable to making built-up multilayers or for depositing the unit layer. In this case the shallow troughs, preferrably about 6 mm in depth, are strongly preferred. For example, according to the teachings of this invention, it is preferred that the diamine-containing subphase be replaced by distilled water in order to avoid the presence of excess monomer in the unit layer or in the bulit-up multilayer.

After transfer, the unit layer or a built-up multilayer containing it can optionally be subjected to a heat-treatment step. According to the teachings of this invention, this step is preferably carried out in vacuum at a temperature above 100° C. Although this invention is not bound by any theory, the heat treatment step is thought to remove undissolved alkylamine byproduct.

According to the teachings of this invention, the essentially monomeric polyfunctional aldehyde or its precursor is spread onto the surface of a reactive aqueous subphase. The criteria for the spreading of organic compounds on water surfaces are generally known to the art (see, for example, A. W. Adamson, "Physical Chemistry of Surfaces," 4th ed.; Wiley: New York, 1982; Chapter IV, or G. L. Gaines, Jr., "Insoluble Monolayers at the Air/Water Interface,"; Wiley: New York, 1966; Chapter 4). Briefly, to be spreadable, the attractive forces between the compound to be spread and the water surface must be strong enough to overcome the cohesive forces of the compound itself. Otherwise the compound will simply crystallize on the water surface and will not spread, such as is the case for terephthalaldehyde and terephthalic acid. In the case of organic liquids, the equilibrium situation is considered to be a monolayer with excess liquid collecting in the form of lenses on the surface (A. W. Adamson, "Physical Chemistry of Surfaces," 4th ed.; Wiley: New York, 1982; p 106). Also, to be spreadable for the purposes of this invention, the compound must be insoluble enough and involatile enough so that it will remain at the surface for the duration of the reaction. According to the teachings of this invention, essentially monomeric aldehydes which are spreadable themselves, especially those in the liquid state, can be used directly. Polyfunctional aldehydes which do not spread at the air/water interface, are, according to the teachings of this invention, converted to aldehyde precursors which do spread at the air/water interface. This is preferably accomplished by condensing the object polyfunctional aldehyde with an alkyl amine so as to form the corresponding polyfunctional aldehyde precursor, in this case a polyfunctional aldimine. The alkyl group is preferably one which results in the polyfunctional aldehyde precursor being a liquid and is preferably an alkyl chain of length greater than or equal to four carbons. The polyfunctional aldehyde precursor may alternatively be a solid as is the case with didodecyl terephthalaldimine and dioctadecyl terephthalaldimine. These also can be spread on the water surface since the alkyl chains prevent crystallization. In general, in the case of a solid, there must be a polar group to provide sufficiently strong interactions with the water surface.

According to the teachings of this invention, the essentially polyfunctional aldehyde or its spreadable precursor is applied by means of a spreading solvent. Although this invention is not bound by any theory, it is thought that the spreading solvent serves mainly to separate the object molecules enough that the molecules can interact individually with the water surface and rapidly come to equilibrium. The use of a spreading solvent also serves to control the amount of compound applied to the subphase surface. The preferred properties of spreading solvents are known to the art (see, for example, G. L. Gaines, Jr., "Insoluble Monolayers at the Air/ Water Interface,"; Wiley: New York, 1966). These are that it be volatile enough that evaporates quickly, preferable in less than five minutes of spreading, that it spreads by itself on the water surface without the formation of stable lenses, that it dissolve the compound to be spread, and that it be essentially insoluble in the subphase. Preferred solvents which possess these properties include chloroform, toluene, benzene, dichloroethane, and mixtures of hexane or heptane with diethyl ether.

The preferred concentration of the compound to be spread in the spreading solvent is between 0.001 and 0.1 wt %, these concentrations providing sufficient control of quantity. According to the teachings of this invention, the solution of the essentially monomeric polyfunctional aldehyde or its precursor, preferably in chloroform, is spread on the subphase in a quantity sufficient to yield a final area per molecule, upon evaporation of the spreading solvent, greater than 0.2 square nanometers. During the reaction period, the area per spread molecule is preferably kept constant.

The subphase is preferably made from highly purified water, preferably triply distilled with a predistillation pass through an ion-exchange column, charcoal filter, and membrane filter, preferably in that order. The final distillation is preferably by means of a non-aerosol-forming still with a quartz heating element.

According to the teachings of this invention, the essentially monomeric polyfunctional amine is dissolved in the subphase at a concentration preferably between 0.001 and 0.05 molar. The preferred pH range is below 5 and within one pH unit of the $pk_{a1}$ of the polyfunctional amine.

The temperature of the subphase is preferably between 5° and 15° C.

The method which is an object of this invention can be conducted with one of several commercially available film balance troughs or with one that is custom-made. The trough is preferably less than one centimeter deep and is made of materials which will not react with the subphase and will not release contaminants, preferably fluorocarbon plastics or fluorocarbon-coated metals. An automated constant pressure-constant area capability is preferred but not essential since piston oils can be used to maintain constant pressure during transfer of the surface layer to a substrate.

According to the teachings of this invention, after the polycondensation is completed the polymeric imine unit surface layer can be transferred to a substrate. The preferred substrates are those on which a hydrophilic surface can be generated. These include semiconductors which have natural oxide surface layers such as silicon, germanium, and gallium arsenide Hydrophilic oxide surfaces are naturally present on most metals or can be generated either by heating in air or oxygen or generated electrochemically according to procedures known to the art. Glass, quartz, and sapphire also have hydrophilic surfaces when sufficiently clean. The substrate chosen for transfer must be clean. Several cleaning procedures are known to the trade (see, for example, G. Goldfinger, ed., "Clean Surfaces: Their Preparation and Characterization for Interfacial Studies," Marcel Dekker: New York, 1970). Metals or metal-coated substrates can be cleaned and made hydrophilic by heating in air at about 400° C. for preferably more than 5 minutes. Semiconductors are cleaned by one of several known procedures.

According to the teaching of this invention, the deposition of the first layer is most critical The substrate is lowered into the subphase through the unit surface layer at a speed preferably between 5 and 20 cm/min. Either during this lowering or after it, a constant surface pressure, preferably between 15 and 25 mN/m, is applied to the unit surface layer. After initial application of the constant surface pressure, the surface layer is preferably allowed to relax under pressure preferably for a minimum of two hours. The substrate is then withdrawn out of the substrate at a speed preferably less than 1 cm/min. The transfer of the surface layer to the substrate can be monitored by observing the decrease in surface area corresponding to the selected constant surface pressure. Before deposition of subsequent layers, the adhesion of the first unit layer to the substrate can be improved by aging it, preferably for more than two hours. Subsequent layers are transferred as for the first layer, the preferred lifting speed being between 0.5 and 2 cm/minute.

The ultrathin polymeric imine films which are objects of this invention and which are obtained by means of the process which is an object of the invention possess several special, useful properties, including high heat stability, high hardness, chemical stability, solvent stability and transparency.

BRIEF DESCRIPTION OF THE DRAWING

The FIGURE shows the FTIR spectrum of the multilayer prepared according to Experimental Example 1 (top) together with the FTIR spectrum of the polymer prepared according to Comparative Example 1 (bottom).

EXAMPLES

In the following examples, the Langmuir-Blodgett trough used was a Lauda-made Filmwaage. Ellipsometer measurements were made with a Shimadzu EP-10 ellipsometer equipped with a He-Ne laser light source.

COMPARATIVE EXAMPLE 1

Poly(p-phenylene terephthalaldimine) was synthesized in m-cresol according to Japan Patent Application No. 52-124097. In 20 ml m-cresol was dissolved 0.54 g p-phenylenediamine and 0.67 g terephthalaldehyde. This solution was stirred for 4 h at room temperature. The product polymer was isolated by pouring the m-cresol reaction solution into methanol, whereupon the polymer precipitated. The precipitate was washed with water and dried. The lower infrared spectrum shown in FIG. 1 is of a KBr pellet of te product polymer.

EXPERIMENTAL EXAMPLE 1

The dialdehyde precursor, didodecyl terephthalaldimine, was prepared by refluxing together in 100 ml of ethanol 1.0 g of terephthalaldehyde and 2.76 g of dodecylamine. The crystals which formed upon cooling overnight were recrystallized from ethanol, yielding the desired didodecyl terephthalaldimine, mp 54.8°–55.0° C. The structure was confirmed by NMR, infrared spectroscopy, and elemental analysis. This product was dissolved in freshly distilled chloroform to a concentration of 0.071 wt %. This solution (1.08 g) was placed dropwise onto the surface of a 10° C. subphase containing p-phenylenediamine at a concentration of 3 millimolar and with a pH of 4.4. The final area of the spread terephthalaldimine was 0.20 sq nm/molecule. This was allowed to react overnight and the subphase changed by passing 5 l of triply distilled water under the produced surface film. This resultant unit surface film was compressed to a surface pressure of 20 mN/m, then allowed to relax under this pressure for two hours. A calcium fluoride plate, which had been freshly cleaned by placing it in conc. sulfuric acid/30% aqueous hydrogen peroxide (4:1 v/v) for 5 min followed by rinsing with copious amounts of triply distilled water, was lowered through the film at a rate of 10 cm/min. No surface film attached itself while the plate was being lowered. With the surface pressure being held constant at 20 mN/m, the plate was raised back up through the film at 0.5 cm/min. By the decrease in the surface area corresponding to the applied 20 mN/m surface pressure, the transfer of a unit layer to the plate was detected. Subsequent unit layers were transferred one-by-one by continuing this dipping procedure until a total of 25 layers was deposited. Between depositions the plate was held in air for 2 min 15 sec; after lowering the plate its motion was stopped for 1 min 8 sec. The ratio of surface area of the film transferred to that of the plate averaged 0.4 over the 25 depositions. The top spectrum in FIG. 1 is the infrared spectrum of this deposited film, the spectrum being taken of the built-up film on the calcium fluoride plate with another calcium fluoride plate as reference. The UV-visible spectrum of this film showed a characteristic absorption maximum at 435 nm.

EXPERIMENTAL EXAMPLE 2

The procedure of Experimental Example 1 was followed except that the aldehyde precursor was dihexyl terephthalaldimine which was prepared according to the procedure of Experimental Example 1 except that the liquid product was purified by vacuum distillation. The film produced at the subphase surface was compressed to a surface pressure of 21 mN/m and tranferred to two fused silica plates which were clamped back-to-back in order to have deposition on only one face. For tranfer of the first unit layer, the pair was raised at 0.5 cm/min. Subsequent unit layers were transferred with a raising speed of 1.5 cm/min. A total of 11 unit layers were built-up of the plates with an average transfer ratio of 1.55. The UV-visible spectrum of the resultant plate-film composite showed the characteristic 435 nm absorption peak. Ellipsometric measurement of the deposited film showed that it had a refractive index of 1.72 and a thickness of 36 nm. The unit layer thickness was thus 3.3 nm.

EXPERIMENTAL EXAMPLE 3

The procedure of Experimental Example 2 was followed except that the resultant surface film was transferred onto a hydrophilic silicon surface. The silicon was cleaned as for the fused silica plates of Example 2. Seven unit layers were transferred and built-up onto the silicon with an average transfer ratio of 1.3.

EXPERIMENTAL EXAMPLE 4

The procedure of Experimental Example 2 was followed except that the resultant unit surface layer was transferred to aluminum which had been evaporated onto a glass slide then made hydrophilic be heating at 420° C. in air for 20 min. A total of 26 unit layers were transferred and built-up on the aluminum substrate with an average transfer ratio of 0.7.

EXPERIMENTAL EXAMPLE 5

The procedure of Experimental Example 2 was followed except that the resultant unit surface films were transferred to a germanium plate which had been cleaned and made hydrophilic by a 10 sec dip in KOH/-MeOH cleaning solution followed by copious washing with triply distilled water.

EXPERIMENTAL EXAMPLE 6

The procedure of Experimental Example 2 was followed except that the unit surface film was transferred to a chrome plated glass slide which had been cleaned and made hydrophobic by heating to 400° C. in air for 30 min. A total of three unit layers were tranferred and built up with an average transfer ratio of 1.4.

EXPERIMENTAL EXAMPLE 8

The dialdehyde precursor, 1,4-di-(n-octadecyliminomethyl)benzene, was prepared according to the procedure described in Experimental Example 1 (m.p. 74.4°–75.5° C.) and dissolved in the distilled chloroform to a concentration of 0.04 wt %. The subphase was 0.04 molar p-phenylenediamine, adjusted to pH4.41 with concentrated HCl, the total volume of subphase being one liter. With the temperature of the trough regulated at 20.4° C., 0.440 g of dialdehyde precursor solution was applied dropwise to the subphase surface to an area per molecule of 56.3 square nanometers. The polycondensation reaction was continued for 14.5 hours, during which the surface pressure rose from 6.0 to 10.7 mN/m. A constant pressure of 24 mN/m was applied while allowing the surface area to relax for 2 hours. Initially after application of the pressure, the surface area decreased to 0.48 sq.nm/molecule then slowly decreased further to 0.44 sq.nm/molecule. The constant pressure was stopped and the reactive subphase replaced with distilled water by introducing the water outside the trough barrier at one end while drawing off excess solution from the opposite end. A total of five liters of distilled water was used to complete the exchange. A constant pressure of 24 mN/m was applied, whereupon the surface area initally decreased to 0.20 sq.nm/molecule, then relaxed over a period of 150 minutes to 0.11 sq.nm/molecule. The resulting monolayer was deposited as a stepped multilayer onto a calcium fluoride plate. For the first layer the plate was raised through the surface of the subphase at a speed of 1.5 mm/min. For the second layer, this speed was doubled, then doubled again for the remaining layers. The first three layers were 23 mm long with the remaining four being 13 mm long. The resultant built-up Z-type multilayer was heat-treated in a 1 Torr vacuum for 180 minutes at 100° C. Analysis of the infrared spectra taken before and after heat treatment showed that the content of aliphatic material remaining in the film had been reduced by half.

EXPERIMENTAL EXAMPLE 9

The procedure of Experimental Example 1 was followed except that the dialdehyde precursor was 2,6-didocecyl naphthalenedicarboxaldimine which had been prepared from dodecylamine and 2,6-naphthalenedicarboxaldehyde according to the procedure of Experimental Example 1. The concentration of the spreading solution was 0.05 wt % and the subphase temperature during the reaction was 20.4° C. The resultant unit surface layer was tranferred to a calcium fluoride plate (total of 11 unit layers transferred and built up). The C=N stretching band observed at 1612 Kaysers in the infrared spectrum confirmed the formation of poly(1,4-phenylene 2,6-naphthalenedicarboxaldimine).

EXPERIMENTAL EXAMPLE 10

The procedure of Experimental Example 9 was followed except that the resulting unit layer was transferred to two fused silica plates clamped back-to-back. A total of 11 unit layers were built up. Ellipsometric measurement of this built-up multilayer showed that it had a refractive index of 2.06 and a thickness of 17.0 nm corresponding to a unit layer thickness of 1.5 nm.

EXPERIMENTAL EXAMPLE 11

The procedure of Experimental Example 1 was followed except that the diamine was 1,5-diaminonaphthalene. The diamine was dissolved in the subphase to a concentration of 1 millimolar at pH 3.21. The dialdehyde precursor, didodecyl terephthalaldehyde, was spread to a surface area of 0.8 sq nm/molecule. The resultant unit surface layer was transferred and built up on a calcium fluoride plate, the infrared spectrum of which showed the characteristic aromatic C=N stretch peak at 1620 Kaysers, confirming the formation of poly(1,5-naphthalene 1,4-phenylenedicarboxaldimine).

I claim:

1. A composite material comprising an ultrathin film deposited on a solid substrate, said ultrathin film comprising a polymeric imine comprising the repeat unit

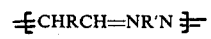

in which R is aromatic, heteroaromatic, olefinic, acetylenic, or a mixture of these, and R' is aromatic, heteroaromatic, olefinic, acetylenic, or a mixture of these, said film comprising one or more unit layers or comprising built-up multilayers which include one or more of said unit layers, each said unit layer having a thickness of less than 20 nanometers.

2. A composite material according to claim 1 comprising an ultrathin film deposited on a solid substrate, wherein said polymeric imine comprises the repeat unit

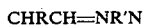

wherein R is aromatic and R' is aromatic.

3. A composite material according to claim 2 wherein R' is selected from the group consisting of phenyl and naphthyl.

4. A composite material according to claim 2 wherein said polymeric imine comprises the repeat unit

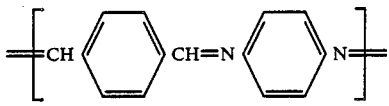

5. A composite material according to claim 2 wherein said polymeric imine comprises the repeat unit

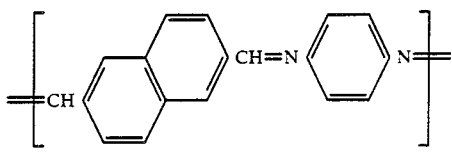

6. A composite material according to claim 2 wherein said polymeric imine comprises the repeat unit

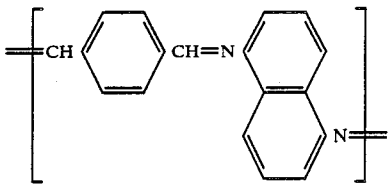

7. A composite material according to claim 2 wherein said solid substrate is silica.

8. A composite material according to claim 2 wherein said solid substrate is aluminum.

9. A composite material according to claim 2 wherein said solid substrate is chromium.

10. A composite material accordigg to claim 2 wherein R is selected from the group consisting of phenyl and naphthyl.

11. A composite material according to claim 10 wherein said solid substrate is a semiconductor.

12. A composite material according to claim 11 wherein said semiconductor is silicon.

13. A composite material according to claim 11 wherein said semiconductor is germanium.

* * * * *